United States Patent
Shi et al.

(10) Patent No.: US 9,299,864 B2
(45) Date of Patent: Mar. 29, 2016

(54) GE/SI AVALANCHE PHOTODIODE WITH INTEGRATED HEATER AND FABRICATION THEREOF

(71) Applicant: SiFotonics Technologies Co., Ltd., Woburn, MA (US)

(72) Inventors: Tuo Shi, Beijing (CN); Pengfei Cai, Beijing (CN); Liangbo Wang, Beijing (CN); Nai Zhang, Fremont, CA (US); Wang Chen, Beijing (CN); Su Li, Beijing (CN); Ching-yin Hong, Lexington, MA (US); Mengyuan Huang, Beijing (CN); Dong Pan, Andover, MA (US)

(73) Assignee: SiFotonics Technologies Co., Ltd., Woburn, MA (US)

( * ) Notice: Subject to any disclaimer, the term of this patent is extended or adjusted under 35 U.S.C. 154(b) by 0 days.

(21) Appl. No.: 14/605,524

(22) Filed: Jan. 26, 2015

(65) Prior Publication Data

US 2015/0243800 A1 Aug. 27, 2015

Related U.S. Application Data

(60) Provisional application No. 61/966,353, filed on Feb. 21, 2014.

(51) Int. Cl.
*H01L 31/107* (2006.01)
*H01L 31/024* (2014.01)
*H01L 31/028* (2006.01)
*H01L 31/0232* (2014.01)
*H01L 31/18* (2006.01)
*H01L 31/0203* (2014.01)

(52) U.S. Cl.
CPC .......... *H01L 31/024* (2013.01); *H01L 31/0203* (2013.01); *H01L 31/028* (2013.01); *H01L 31/02327* (2013.01); *H01L 31/1075* (2013.01); *H01L 31/1804* (2013.01)

(58) Field of Classification Search
CPC ............ H01L 25/167; H01L 27/14643; H01L 31/02024–31/0203; H01L 31/1032; H01L 31/107; H01L 29/6609–29/66113
See application file for complete search history.

(56) References Cited

U.S. PATENT DOCUMENTS

2014/0151839 A1* 6/2014 Kang .................. H01L 33/0012 257/438

* cited by examiner

*Primary Examiner* — David Vu
*Assistant Examiner* — Cuong Nguyen
(74) *Attorney, Agent, or Firm* — Han IP Corporation

(57) ABSTRACT

Various embodiments of a novel structure of a Ge/Si avalanche photodiode with an integrated heater, as well as a fabrication method thereof, are provided. In one aspect, a doped region is formed either on the top silicon layer or the silicon substrate layer to function as a resistor. When the environmental temperature decreases to a certain point, a temperature control loop will be automatically triggered and a proper bias is applied along the heater, thus the temperature of the junction region of a Ge/Si avalanche photodiode is kept within an optimized range to maintain high sensitivity of the avalanche photodiode and low bit-error rate level.

13 Claims, 5 Drawing Sheets

GE/SI AVALANCHE PHOTODIODE WITH INTEGRATED HEATER AND FABRICATION THEREOF

CROSS-REFERENCE TO RELATED PATENT APPLICATION(S)

This application is the non-provisional application of, and claims the priority benefit of, U.S. Patent Application No. 61/966,353, filed on Feb. 21, 2014, which is herein incorporated by reference in its entirety.

TECHNICAL FIELD

The present disclosure is related to photonic devices. More particularly, the present disclosure is related to an integrated structure of an avalanche photodiode and a heater thereof.

BACKGROUND

Avalanche photodiodes (APDs) are widely utilized for fiber-optic communications due to higher sensitivity benefitting from carrier multiplication mechanism. Traditional III-V APD receivers offer more than 6 dB sensitivity improvement up to 10 Gb/s data rate when compared to PIN photodiodes (PD). However, InP-based APDs show limited gain-bandwidth product and high multiplication noise due to large k-factor, i.e., ratio of impact ionization coefficients. Silicon (Si)-based APDs have been demonstrated to be the best device for high-speed communication applications, where germanium (Ge) is used as absorption material. Ge material is an indirect band-gap material. When under tensile strain, both Ge L-band and r-band shrink, but the direct Γ-band shrinks faster and becomes a direct band-gap material, thereby the Ge absorption coefficient to longer-wavelength incident light increases. Additionally, Ge material can be utilized in APDs for C-band applications (around 1500 nm or 1550 nm) and fiber-to-the-home (FTTH) applications (around 1577 nm). Typically C-band application applies industrial standard, where the operational temperature ranges from −40° C. to 85° C., while the operational temperature range of FTTH application is usually from −20° C. to 75° C. With wavelength around 1550 nm and 1577 nm, the Ge material absorption coefficient is sensitive to temperature, and GeSi APD sensitivity deteriorates seriously when operating in a lower-temperature environment instead of room temperature.

One approach to maintain Ge PD performance at lower temperature is to mount a 30Ω resistor on the top-surface of a 6-pin transistor outline (TO)-header, as illustrated in FIG. 1. When a 3.3V bias voltage is applied on the resistor, the heat generated in the resistor can heat up the TO-header and increase TO temperature by about tens of degrees depending on consumption power. Accordingly, the sensitivity performance of Ge/Si APDs can be improved to meet specified requirements. Since there is a gap of hundreds of microns between the resistor and Ge/Si APD chip, a time period of typically tens of seconds is required to transfer heat from the resistor to the Ge region via TO-header, as shown in FIG. 1. As a result, the efficiency and response speed of this approach is too low for practical applications.

SUMMARY

In one aspect, an apparatus may include a substrate, at least one top-illuminated Ge/Si avalanche photodiode, and at least one heater. The at least one top-illuminated Ge/Si avalanche photodiode may be formed on a primary side of the substrate. The Ge/Si avalanche photodiode may include a first Si layer, a second Si layer, a charge layer, a Ge layer, and a doped layer. The first Si layer may be doped with dopants of a first type. The second Si layer may function as a multiplication layer, and may be un-intentionally doped, lightly doped with dopants of the first type at a concentration of less than $5E17$ $cm^{-3}$, or lightly doped with dopants of a second type at a concentration of less than $5E17$ $cm^{-3}$. The charge layer may be doped with dopants of the second type. The Ge layer may function as an absorption layer, and may be un-intentionally doped, lightly doped with dopants of the first type at a concentration of less than $5E17$ $cm^{-3}$, or lightly doped with dopants of the second type at a concentration of less than $5E17$ $cm^{-3}$. The doped layer may be doped with dopants of the second type. The at least one heater may be integrated in or on the substrate. When an environmental temperature is below a threshold temperature and in response to a bias being applied thereon, the at least one heater may be configured to increase a temperature of the structure to maintain a level of sensitivity of the Ge/Si avalanche photodiode structure.

In another aspect, a method of fabrication of an apparatus may include: forming a Ge/Si avalanche photodiode on a primary side of a silicon-on-insulator (SOI) substrate, the SOI substrate comprising a top Si layer, a Si substrate layer, and a buried oxide (BOX) layer disposed between the top Si layer and the Si substrate layer; performing a first etch process on the top Si layer of the SOI substrate; performing a second etch process on the BOX layer of the SOI substrate till the Si substrate layer to expose a portion of the Si substrate layer of the SOI substrate; forming at least one integrated heater in the SOI substrate; depositing a dielectric layer for insulation; performing a dielectric etch process to fabricate one or more contacts; performing a salicide process; performing a metal deposition process; and performing a metal etch process.

In yet another aspect, a method of fabrication of an apparatus may include: forming a Ge/Si avalanche photodiode on a top Si layer of a silicon-on-insulator (SOI) substrate, the SOI substrate further comprising a buried oxide (BOX) layer below the top Si layer; performing an ion implantation process on a portion of the top Si layer to form a resistive component of at least one integrated heater in a region doped with dopants of a first type; depositing a dielectric layer for insulation; performing a dielectric etch process to fabricate one or more contacts; performing a salicide process; performing a metal deposition process; and performing a metal etch process.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Example Implementations

To solve the aforementioned problems, the present disclosure provides an avalanche photodiode with an integrated heater, and a fabrication method thereof.

Figure 1:
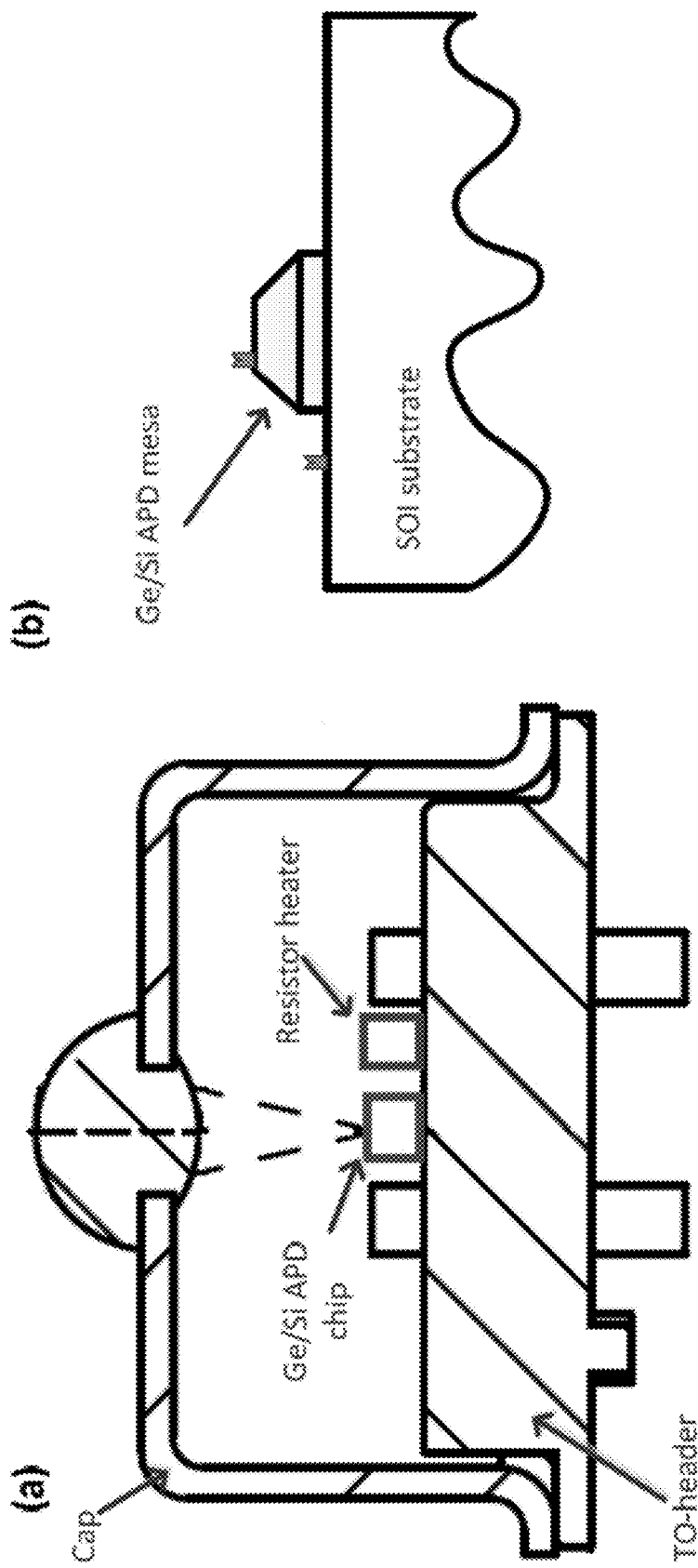
FIG. 1 shows a conventional 6-pin TO-header solution for Ge/Si APD. (a) TO-header mounted with Ge/Si APD chip and resistor heater and (b) Ge/Si APD chip.
Figure 2:
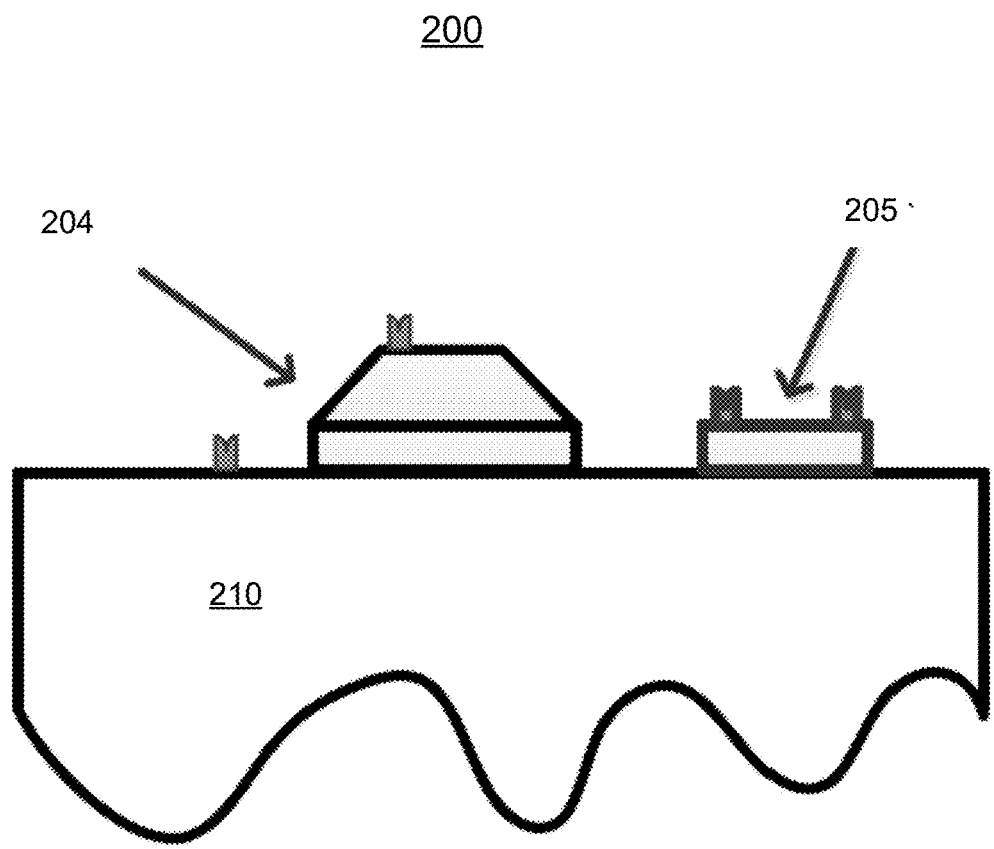
FIG. 2 shows a Ge/Si avalanche photodiode with at least one heater integrated therein in accordance with an embodiment of the present disclosure.

FIG. 2 shows a cross-sectional view of an apparatus 200 that includes a Ge/Si avalanche photodiode 204 with at least one heater integrated therein in accordance with an embodiment of the present disclosure. As shown in FIG. 2, Ge/Si avalanche photodiode 204 includes at least one integrated heater formed on top of a substrate 210, which may be a silicon-on-insulator (SOI) substrate. Substrate 210 may include silicon substrate layer, a buried (BOX) layer, and a top Si layer, with BOX layer disposed between silicon substrate layer and top Si layer.

In terms of fabrication process, firstly a mesa-structure Ge/Si avalanche photodiode 204 is formed on top Si layer, followed by deposition of at least one resistive component to function as at least one heater 205. The at least one resistive component of the at least one heater 205 may have resistance of about 10~50Ω. In some implementations, the at least one heater 205 may include metal or TaN. A doped well doped with dopants of a second type (e.g., p type) may be formed by another ion implantation process to block electrical current from diffusing to substrate 210. A passivation layer may then be formed over the at least one heater 205 and Ge/Si avalanche photodiode 204. The passivation layer may also serve as the anti-reflection layer of the mesa-structure Ge/Si avalanche photodiode. Finally, electrically-conductive pads (e.g., aluminum pads) may be formed on top of the at least one heater 205 and Ge/Si avalanche photodiode 204, respectively, after a pad open process.

When the environmental temperature decreases to a certain point, e.g., below a threshold temperature, a temperature control loop may be automatically triggered to apply a proper bias voltage on the at least one heater 205, i.e., to activate or turn on the at least one heater 205. Accordingly, the temperature of the junction region of Ge/Si avalanche photodiode 204 may be increased efficiently and quickly. Temperature is kept within an optimized range to maintain a high level of sensitivity of Ge/Si avalanche photodiode 204 as well as a low bit-error rate level of Ge/Si avalanche photodiode 204.

Figure 3:
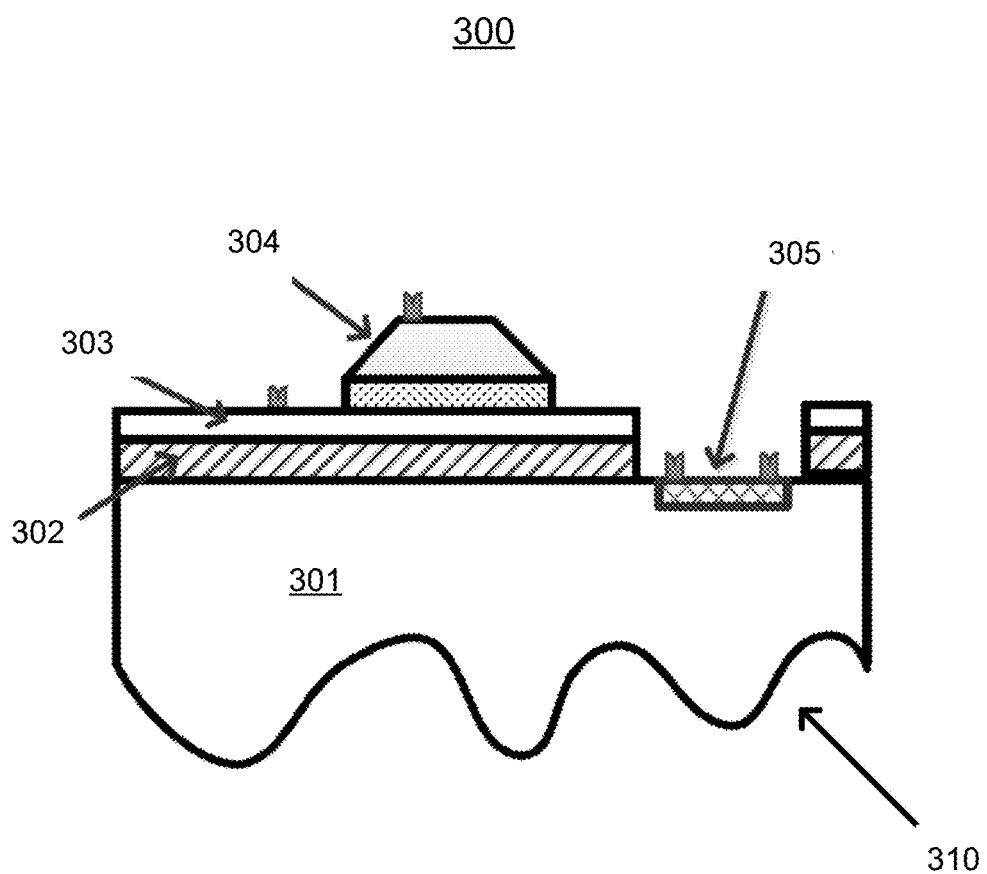
FIG. 3 shows a Ge/Si avalanche photodiode with at least one heater integrated therein in accordance with another embodiment of the present disclosure.

FIG. 3 shows a cross-sectional view of an apparatus 300 that includes a Ge/Si avalanche photodiode 304 with at least one heater integrated therein in accordance with an embodiment of the present disclosure. As shown in FIG. 3, Ge/Si avalanche photodiode 304 includes at least one integrated heater formed on a top portion of a Si substrate layer 301 underneath a buried oxide (BOX) layer 302 of a silicon-on-insulator (SOI) substrate 310. SOI substrate 310 may include silicon substrate layer 301, BOX layer 302, and a top Si layer 303, with BOX layer 302 disposed between silicon substrate layer 301 and top Si layer 303.

In terms of fabrication process, firstly a mesa-structure Ge/Si avalanche photodiode 304 is formed on top Si layer 303. Then, a doped region doped with dopants of the first type (e.g., n type) is formed in silicon substrate layer 301 by ion implantation process to function as at least one heater 305. The at least one heater 305 may include a resistive component having resistance of about 10~50Ω. In some implementations, the at least one heater 305 may include metal or TaN. A passivation layer is then formed over the at least one heater 305 and Ge/Si avalanche photodiode 304. The passivation layer may also serve as the anti-reflection layer of the mesa-structure Ge/Si avalanche photodiode. Finally, electrically-conductive pads (e.g., aluminum pads) may be formed on top of the at least one heater 305 and Ge/Si avalanche photodiode 304, respectively, after a pad open process.

When the environmental temperature decreases to a certain point, e.g., below a threshold temperature, a temperature control loop may be automatically triggered to apply a proper bias voltage on the at least one heater 305, i.e., to activate or turn on the at least one heater 305. Accordingly, the temperature of the junction region of Ge/Si avalanche photodiode 304 may be increased efficiently and quickly. Temperature is kept within an optimized range to maintain a high level of sensitivity of Ge/Si avalanche photodiode 304 as well as a low bit-error rate level of Ge/Si avalanche photodiode 304.

Figure 4:
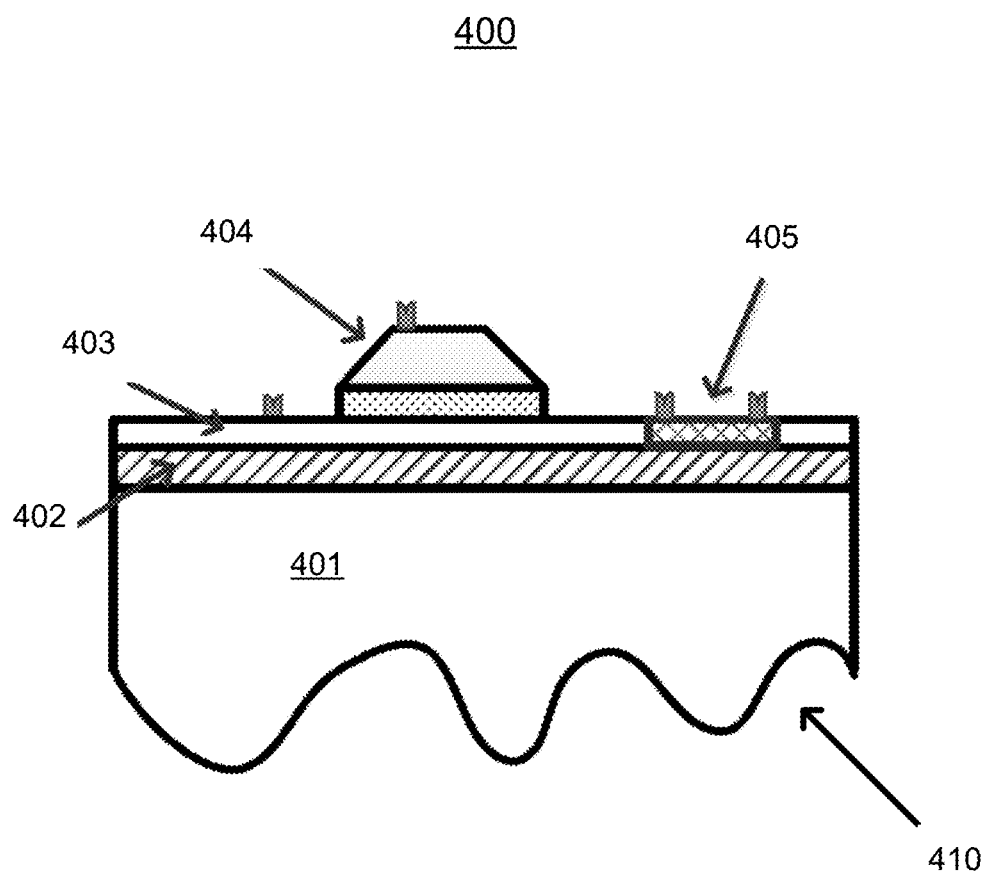
FIG. 4 shows a Ge/Si avalanche photodiode with at least one heater integrated therein in accordance with yet another embodiment of the present disclosure.

FIG. 4 shows a cross-sectional view of an apparatus 400 that includes a Ge/Si avalanche photodiode 404 with at least one heater integrated therein in accordance with an embodiment of the present disclosure. As shown in FIG. 4, Ge/Si avalanche photodiode 404 includes at least one integrated heater formed on a top portion of a Si substrate layer 401 underneath a buried oxide (BOX) layer 402 of a silicon-on-insulator (SOI) substrate 410. SOI substrate 410 may include silicon substrate layer 401, BOX layer 402, and a top Si layer 403, with BOX layer 402 disposed between silicon substrate layer 401 and top Si layer 403.

In terms of fabrication process, firstly a mesa-structure Ge/Si avalanche photodiode 404 is formed on top Si layer 403. Then, a doped region doped with dopants of the first type (e.g., n type) is formed in top Si layer 403 by ion implantation process to function as at least one heater 405. The at least one heater 405 may include a resistive component having resistance of about 10~50Ω. In some implementations, the at least one heater 405 may include metal or TaN. A passivation layer is then formed over the at least one heater 405 and Ge/Si avalanche photodiode 404. The passivation layer may also serve as the anti-reflection layer of the mesa-structure Ge/Si avalanche photodiode. Finally, electrically-conductive pads (e.g., aluminum pads) may be formed on top of the at least one heater 405 and Ge/Si avalanche photodiode 404, respectively, after a pad open process.

When the environmental temperature decreases to a certain point, e.g., below a threshold temperature, a temperature control loop may be automatically triggered to apply a proper bias voltage on the at least one heater 405, i.e., to activate or turn on the at least one heater 405. Accordingly, the temperature of the junction region of Ge/Si avalanche photodiode 404 may be increased efficiently and quickly. Temperature is kept within an optimized range to maintain a high level of sensitivity of Ge/Si avalanche photodiode 404 as well as a low bit-error rate level of Ge/Si avalanche photodiode 404.

Figure 5:
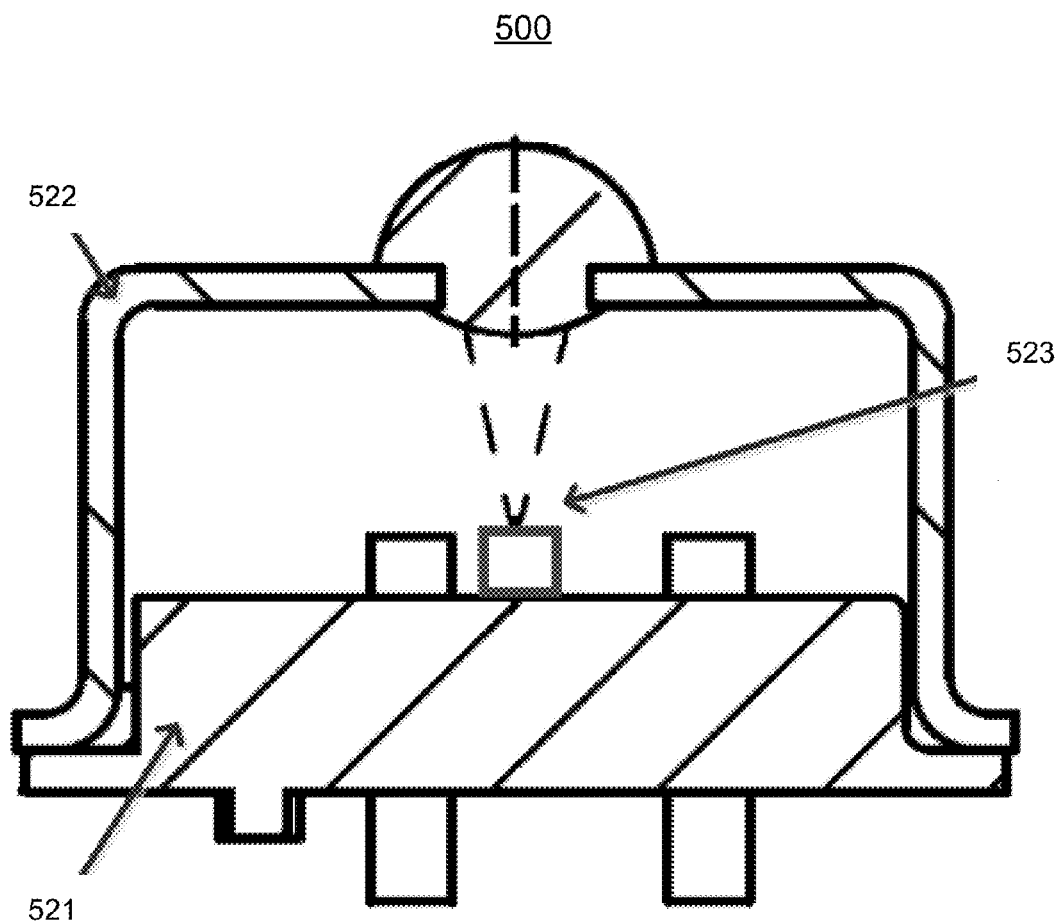
FIG. 5 shows a design of a 6-pin TO solution mounted with heater integrated Ge/Si APD in accordance with an embodiment of the present disclosure.

FIG. 5 is a cross-sectional view of a package that includes 6-pin TO-header 521, a TO-cap 522 and a Ge/Si avalanche photodiode with integrated heater 523. The 6-pin TO-header 521 may be mounted with the at least one heater integrated in Ge/Si avalanche photodiode. An electrode of a resistive component of the at least one heater may be connected to one pin of the 6-pin TO header 521, and another electrode of the resistive component may be connected to a ground or a body of the 6-pin TO-header 521.

Highlights of Select Features

In view of the above, features of the present disclosure are highlighted below.

In one aspect, an apparatus may include a substrate, at least one top-illuminated Ge/Si avalanche photodiode, and at least one heater. The at least one top-illuminated Ge/Si avalanche photodiode may be formed on a primary side of the substrate. The Ge/Si avalanche photodiode may include a first Si layer, a second Si layer, a charge layer, a Ge layer, and a doped layer. The first Si layer may be doped with dopants of a first type. The second Si layer may function as a multiplication layer, and may be un-intentionally doped, lightly doped with dopants of the first type at a concentration of less than $5E17$ $cm^{-3}$, or lightly doped with dopants of a second type at a concentration of less than $5E17$ $cm^{-3}$. The charge layer may be doped with dopants of the second type. The Ge layer may function as an absorption layer, and may be un-intentionally doped, lightly doped with dopants of the first type at a concentration of less than $5E17$ $cm^{-3}$, or lightly doped with dopants of the second type at a concentration of less than $5E17$ $cm^{-3}$. The doped layer may be doped with dopants of the second type. The at least one heater may be integrated in or on the substrate. When an environmental temperature is below a threshold temperature and in response to a bias being applied thereon, the at least one heater may be configured to increase a temperature of the structure to maintain a level of sensitivity of the Ge/Si avalanche photodiode structure.

In some implementations, the at least one heater may include a resistive component.

In some implementations, the resistive component may be fabricated by ion implantation, which may form a doped region doped with dopants of the first type.

In some implementations, the at least one heater may include a doped well doped with dopants of the second type.

In some implementations, dopants of the first type may be n-type dopants, and dopants of the second type may be p-type dopants.

In some implementations, the substrate may include a silicon-on-insulator (SOI) substrate, a bulk Si substrate, or a silicon carbide (SiC) substrate.

In some implementations, the Ge/Si avalanche photodiode may include a waveguide structure.

In some implementations, the Ge/Si avalanche photodiode may further include one or more electrodes, and the at least one heater may include one or more electrodes different than and separate from the one or more electrodes of the Ge/Si avalanche photodiode.

In some implementations, the substrate may include a Si layer and a BOX layer adjacent and below the Si layer. The at least one heater may be formed in the substrate to be adjacent and below the BOX layer of the substrate.

In some implementations, the substrate may include a Si layer and a BOX layer adjacent and below the Si layer, and wherein the at least one heater is formed in the Si layer of the substrate.

In some implementations, the at least one heater may include metal or TaN.

In some implementations, the apparatus may further include a packaging structure that contains the Ge/Si avalanche photodiode therein, and the packaging structure may be of a transistor outline (TO) type or a butterfly type.

In some implementations, the packaging structure may be of the TO type, and the packaging structure may include a 6-pin TO-header mounted with the at least one heater integrated in Ge/Si avalanche photodiode.

In some implementations, an electrode of a resistive component of the at least one heater may be connected to one pin of the 6-pin TO header, and another electrode of the resistive component may be connected to a ground or a body of the 6-pin TO-header.

In some implementations, the apparatus may further include a temperature control loop configured to be triggered to maintain a temperature of the avalanche photodiode in a range using the at least one heater in response to the environment temperature falling below the threshold temperature.

In another aspect, a method of fabrication of an apparatus may include: forming a Ge/Si avalanche photodiode on a primary side of a silicon-on-insulator (SOI) substrate, the SOI substrate comprising a top Si layer, a Si substrate layer, and a buried oxide (BOX) layer disposed between the top Si layer and the Si substrate layer; performing a first etch process on the top Si layer of the SOI substrate; performing a second etch process on the BOX layer of the SOI substrate till the Si substrate layer to expose a portion of the Si substrate layer of the SOI substrate; forming at least one integrated heater in the SOI substrate; depositing a dielectric layer for insulation; performing a dielectric etch process to fabricate one or more contacts; performing a salicide process; performing a metal deposition process; and performing a metal etch process.

In some implementations, in forming the at least one integrated heater in the SOI substrate, the method may perform operations including performing an ion implantation process within a region of the Si substrate layer where a portion of the BOX layer above the Si substrate layer is removed by the second etch process to form a resistive component of at least one integrated heater in a region doped with dopants of a first type.

In yet another aspect, a method of fabrication of an apparatus may include: forming a Ge/Si avalanche photodiode on a top Si layer of a silicon-on-insulator (SOI) substrate, the SOI substrate further comprising a buried oxide (BOX) layer below the top Si layer; performing an ion implantation process on a portion of the top Si layer to form a resistive component of at least one integrated heater in a region doped with dopants of a first type; depositing a dielectric layer for insulation; performing a dielectric etch process to fabricate one or more contacts; performing a salicide process; performing a metal deposition process; and performing a metal etch process.

Additional Notes

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. An apparatus, comprising:
    a substrate;
    at least one top-illuminated Ge/Si avalanche photodiode on a primary side of the substrate, the Ge/Si avalanche photodiode comprising:
        a first Si layer doped with dopants of a first type;
        a second Si layer as a multiplication layer which is un-intentionally doped, lightly doped with dopants of the first type at a concentration of less than $5E17$ $cm^{-3}$, or lightly doped with dopants of a second type at a concentration of less than $5E17$ $cm^{-3}$;
        a charge layer doped with dopants of the second type;
        a Ge layer as an absorption layer which is un-intentionally doped, lightly doped with dopants of the first type at a concentration of less than $5E17$ $cm^{-3}$, or lightly doped with dopants of the second type at a concentration of less than 5E17 cm$^{-3}$; and a doped layer doped with dopants of the second type; and at least one heater integrated in the substrate, wherein, when an environmental temperature is below a threshold temperature and in response to a bias being applied thereon, the at least one heater is configured to increase a temperature of the structure to maintain a level of sensitivity of the Ge/Si avalanche photodiode structure, wherein the substrate comprises a Si layer and a buried oxide (BOX) layer adjacent and below the Si layer, and wherein the at least one heater is formed in the substrate to be adjacent and below the BOX layer of the substrate.

2. The apparatus of claim 1, wherein the at least one heater comprises a resistive component.

3. The apparatus of claim 2, wherein the resistive component is fabricated by ion implantation, which forms a doped region doped with dopants of the first type.

4. The apparatus of claim 2, wherein the at least one heater comprises a doped well doped with dopants of the second type.

5. The apparatus of claim 1, wherein dopants of the first type comprise n-type dopants, and wherein dopants of the second type comprise p-type dopants.

6. The apparatus of claim 1, wherein the substrate comprises a silicon-on-insulator (SOI) substrate, a bulk Si substrate, or a silicon carbide (SiC) substrate.

7. The apparatus of claim 1, wherein the Ge/Si avalanche photodiode comprises a waveguide structure.

8. The apparatus of claim 1, wherein the Ge/Si avalanche photodiode further comprises one or more electrodes, wherein the at least one heater comprises one or more electrodes different than and separate from the one or more electrodes of the Ge/Si avalanche photodiode.

9. The apparatus of claim 1, wherein the at least one heater comprises metal or TaN.

10. The apparatus of claim 1, further comprising a packaging structure that contains the Ge/Si avalanche photodiode therein, wherein the packaging structure is of a transistor outline (TO) type or a butterfly type.

11. The apparatus of claim 10, wherein the packaging structure is of the TO type, and wherein the packaging structure comprises a 6-pin TO-header mounted with the at least one heater integrated in Ge/Si avalanche photodiode.

12. The apparatus of claim 11, wherein an electrode of a resistive component of the at least one heater is connected to one pin of the 6-pin TO header, and wherein another electrode of the resistive component is connected to a ground or a body of the 6-pin TO-header.

13. The apparatus of claim 1, further comprising a temperature control loop configured to be triggered to maintain a temperature of the avalanche photodiode in a range using the at least one heater in response to the environment temperature falling below the threshold temperature.

* * * * *